United States Patent [19]

McKenzie

[11] 4,002,386
[45] Jan. 11, 1977

[54] LOCKING HANDLE APPARATUS

[75] Inventor: Robert W. McKenzie, Lewisville, Tex.

[73] Assignee: Rockwell International Corporation, El Segundo, Calif.

[22] Filed: Nov. 28, 1975

[21] Appl. No.: 635,833

[52] U.S. Cl. .............................................. 312/320
[51] Int. Cl.² ......................................... A47B 88/00
[58] Field of Search ............. 312/320, 333; 211/41; 16/115; 190/58 B, 57

[56] References Cited

UNITED STATES PATENTS

| 2,195,028 | 3/1940 | Finkelstein | 190/58 B |
|---|---|---|---|
| 2,274,536 | 2/1942 | Doppelt | 190/58 B |
| 3,113,651 | 12/1963 | Szabo et al. | 190/58 B |
| 3,129,981 | 4/1964 | Meyer | 312/333 |
| 3,168,173 | 2/1965 | Koffler | 190/58 B |
| 3,224,790 | 12/1965 | Holstein | 16/115 |
| 3,245,546 | 4/1966 | Stuhler | 211/41 |
| 3,513,952 | 5/1970 | Warner, Jr. | 190/58 B |
| 3,566,436 | 3/1971 | Marks et al. | 16/115 |
| 3,567,303 | 3/1971 | Fox et al. | 312/320 |

FOREIGN PATENTS OR APPLICATIONS

| 515,072 | 1955 | Italy | 190/58 B |
|---|---|---|---|
| 207,457 | 1940 | Sweden | 190/58 B |

Primary Examiner—Paul R. Gilliam
Assistant Examiner—V. N. Sakran
Attorney, Agent, or Firm—Bruce C. Lutz; Robert J. Crawford

[57] ABSTRACT

A flexible self-locking handle for mounting modules or the like to a rack or card cage assembly. The handle end portions including means for lockably engaging said rack and including a deformable detent for restraining movement of said handle to that locked position. By flexing said handle, the end portions are translated inwardly to a second detent position thereby releasing the locking condition relevant to the rack assembly and providing a convenient handle for removal of said module from the rack assembly.

3 Claims, 11 Drawing Figures

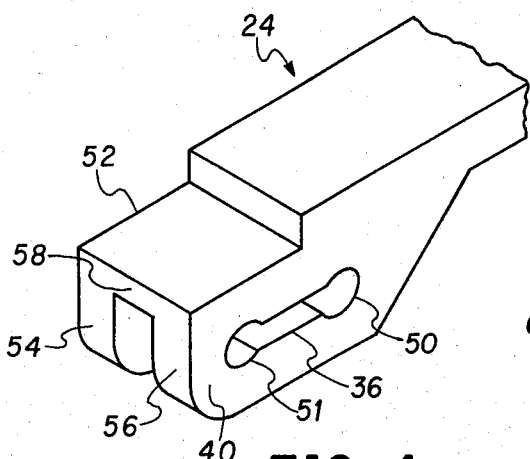
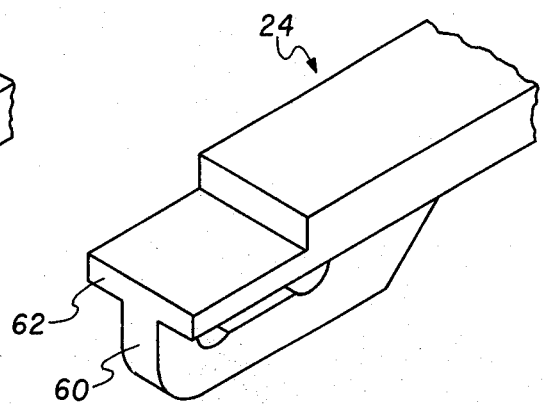
FIG. 4    FIG. 5
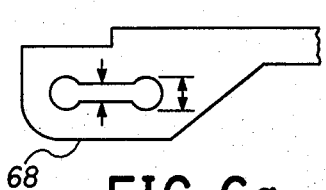
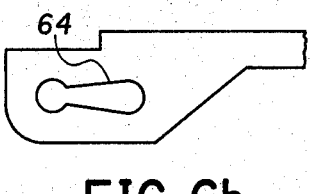
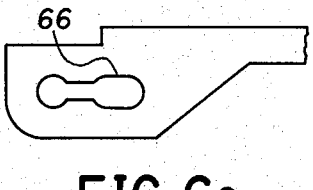
FIG. 6a    FIG. 6b    FIG. 6c
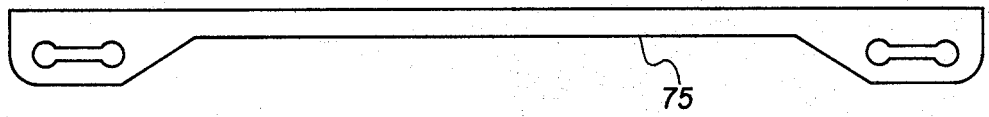
FIG. 7
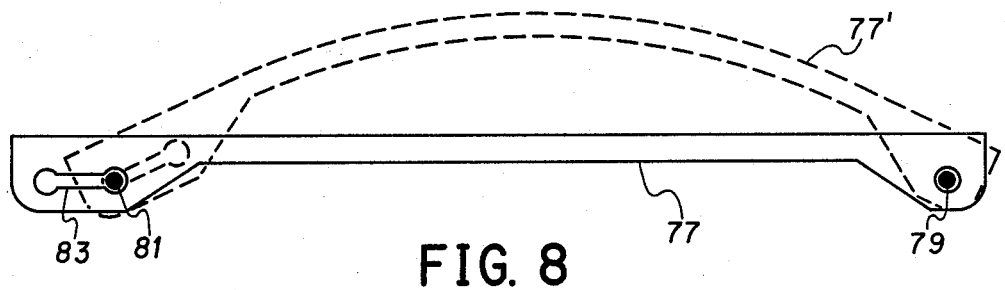
FIG. 8
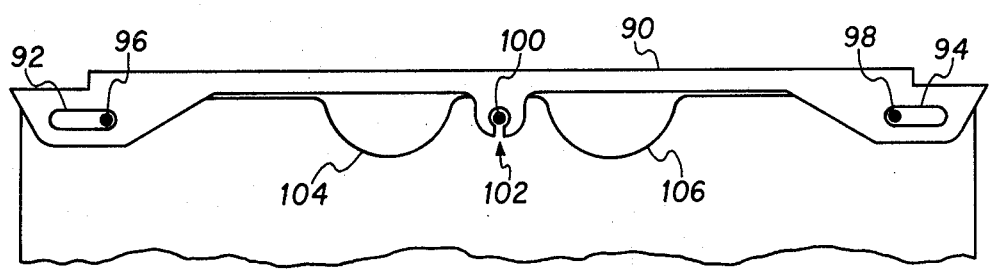
FIG. 9

LOCKING HANDLE APPARATUS

BACKGROUND OF THE INVENTION

This invention relates generally to an integral locking handle and more particularly to a handle which is to be used with a module, which module is normally associated with an electrical circuit connector while positioned within a rack.

The prior art includes self-locking handles, examples of which are illustrated in U.S. Pat. Nos. 3,567,303 and 3,345,546, both of which are assigned to the same assignee as the present invention. This handle provided a locking function while the handle was new. However, it has been ascertained that the handle tends to set in a bowed condition after being used a multiplicity of times for removing the module. When the handle starts to set in a bowed condition, the locking mechanism contained thereon becomes less effective and eventually does not provide the positive locking action originally intented.

It has further been found that especially when the handle is new and contains a large amount of spring action, the handles of the type described in the above-reference patents require a good deal of spring action force to place it in a bowed condition. If the additional force necessary to remove the module from the electrical connector is then applied, the module will often release suddenly from the restraining action of the connector thereupon pinching the fingers of a person's hand between the handle and the sharp edges of the module or printed circuit board. It has further been found that when racks are used containing sharp stamped steel edges rather than the more rounded cast edges of previous racks, that the locking protrusion of the handles of the type illustrated in the referenced patent can be scrapped by the sharp edges upon repeated reinsertion of the module into the rack, causing poor appearance and performance.

Various attempts have been suggested to cure the above problems including providing cutouts in the module wherein the finger pinching does not occur but where there is a resultant waste in printed circuit card and module space that could be used for electronic components, a return to cast rack housings with the resultant increasing in rack costs and weight, etc.

It is therefore an object of the present invention to provide a handle which is superior to all known prior art and overcomes several problems including those briefly referenced above.

Other objects and advantages of the present invention may be ascertained from a reading of the specification and the appended claims in conjunction with the drawing wherein:

FIG. 4 is an isometric detail view of the end of the handle comprising the inventive concept;

FIG. 5 is an isometric view of a T-shaped version of the detent handle concept of this patent;

FIGS. 6A, and 6B and 6C are three variations in the detent mechanisms for different applications;

FIG. 7 is a side view of a handle wherein the locking feature is not required;

FIG. 8 is a side view of a handle which uses the detent mechanism only at one end; and FIG. 9 is a side view of a handle containing the locking mechanism at a center position.

Figure 1:
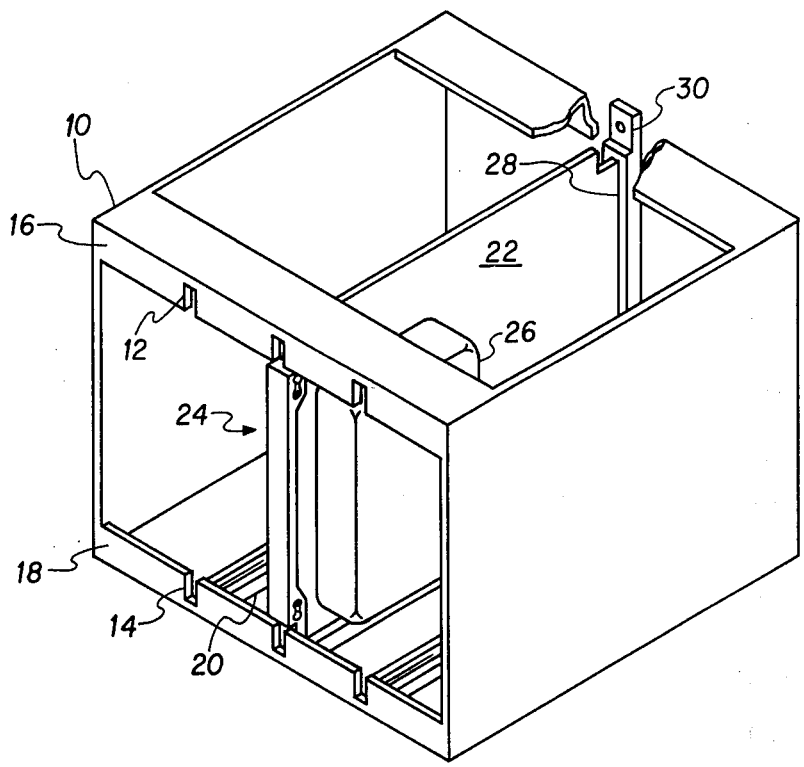
FIG. 1 is an isometric view of the inventive concept mounted on a printed circuit board or module which is positioned within a card cage.

In FIG. 1, a card cage portion of a rack generally illustrated as 10 contains a plurality of upper slots 12 and lower slots 14 in front surfaces 16 and 18, respectively. These slots communicate with tracks such as 20 illustrated on the bottom surface of the card cage 10. Although there are similar tracks on the upper surface behind slots 12, these have been deleted for the purposes of illustration. Within the tracks 20 and interior to the card cage 10 is a printed circuit board generally designated as 22 having a handle 24 with an electronic module attached thereto designated as 26 and which has a printed circuit connection end 28 which is electrically and mechanically connected to a further connector 30. As is well known in the art, either the printed circuit board portion 28 or the connector 30 may contain a male member and the other portion of the electrical connection will receive that member. In the position shown, the handle is in a locked condition and must be flexed to the second detent position in order to remove the board from the rack. In the position shown, extensions of the handle coact with the front surface 16 and 18 to prevent removal of the board.

Figure 2:
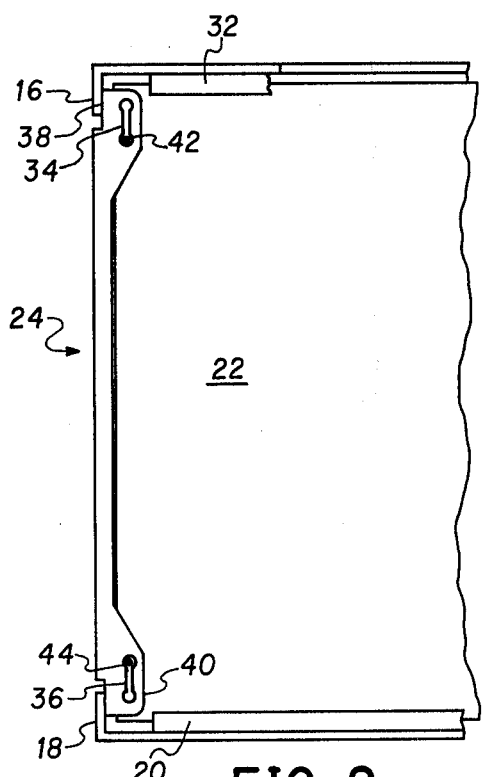
FIG. 2 is a side view of a module in a card cage and in a locked condition.

The above is more clearly illustrated in FIG. 2 wherein the front surfaces 16 and 18 are illustrated along with the track 20 on the lower edge and a further track 32 on the upper edge which contain the printed circuit board 22. As illustrated, the handle 24 has a double detent mechanism in the form of a slot 34 at one end and 36 at the other end. An extension designated as 38 coacts with the surface 16 to prevent removal of the board 22 and an extension 40 at the other end of handle 24 coacts with front surface 18 to prevent removal of the board. As illustrated, the board contains pins 42 and 44. In the locked position shown, these pins forming a part of the circuit board are in the innermost detent position of the handle 24.

Figure 3:
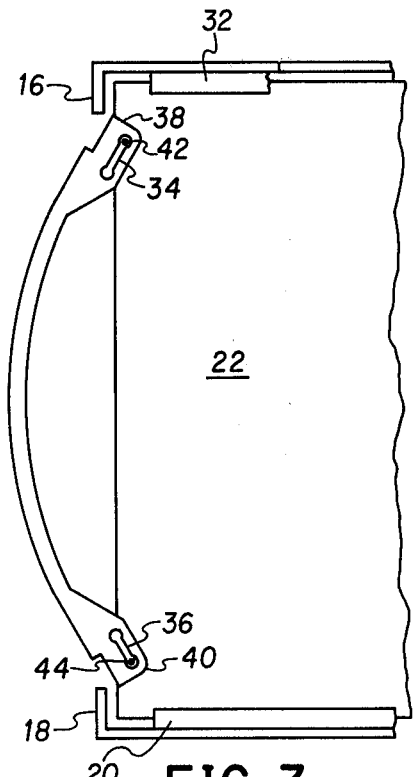
FIG. 3 is a side view of FIG. 2 with the handle flexed to the retrieve or removal position.

In FIG. 3, the handle is shown in the "retrieve" position wherein the board may be removed from the rack. As illustrated, the handle 24 is bowed and held in this position by the pins 42 and 44 in the outermost deformable detent position of slots 34 and 36. In this position, the extremities 38 and 40 do not coact with surfaces 16 and 18 and allow removal of the board.

As mentioned previously, without the detent mechanism, the sharp edges of the stamped sheet steel facings 16 and 18 tend to remove a small amount of material from the handle 24 upon each insertion of the module into the card cage. Thus, the handle utilizing the present design will escape injury over a much longer period of time than would the prior art handles referenced above.

FIG. 4 provides a better illustration of the handle and illustrates that slot 36 contains a first deformable detent position or keyhole 50 and a second deformable detent position or keyhole 51. The handle 24 has a lowered portion 52 much as illustrated in the previous figures for providing the locking action wherein the surface of handle 24 is flush with the surfaces of 16 and 18. However, this recessed portion need not be provided if the board is inserted slightly farther into the card cage. As further illustrated, handle 24 is designed to have a U-shaped portion at each extremity such that the illustrated portions 54 and 56 straddle the printed circuit board 22. The bit portion or portion between legs 54 and 56 is designated as 58 and is contiguous with the remainder of the handle 24.

FIG. 5 illustrates a further handle 24 which is formed in a T-section wherein in most embodiments the leg 60 of the T would fit between two printed circuit boards and pins similar to 42 and 44 would extend between the boards for a balanced pull condition. The top portion 62 of the T may be slightly extended from the edge of and at right angles to the printed circuit boards such that the handle 24 may be conveniently grasped and altered to the flexed condition such as illustrated in FIG. 3.

While the preferred embodiment of the slot such as 36 is illustrated in FIG. 6A, other usable embodiments are illustrated in FIGS. 6B and 6C where there is a certain amount of "slop" or movement in the locked condition. Thus, the second detent portion in 6B is designated as 64 while the second portion in FIG. 6C is designated as 66. The detent areas illustrated in these two figures would not normally be used because of the above-mentioned tendency of a handle to assume a bowed condition after a considerable amount of use. However, there might be instances where such a configuration would be useful, such as on a module where a high tolerance variation exists on the center-line locations of the two pins on the module.

FIG. 6A also illustrates a dimension for the slot which in one embodiment was 0.072 ± 0.002 inches while the keyhole diameter was 0.082 inches with a tolerance of +0.002 and −0.000 inches. The pin used in conjunction with this arrangement was 0.078 ± 002 inches. As will be apparent to those skilled in the art, the stiffness of the detent depends on many factors in addition to the tolerances and include among others the type of material used, the thickness of the legs such as 56 of FIG. 4 and the distance from the slot to the nearest surface such as 68 of the handle.

In FIG. 7, an illustration is provided of a handle 75 which does not reflect the step portion 51 of FIG. 4. This handle would normally be used on a printed circuit board where the locking feature illustrated in FIG. 2 is not required. The two detents are illustrated to prevent the snapping action referenced above from mangling the fingers when the portion corresponding to 28 of module 22 is released from the electrical friction contacts of connector 30 in FIG. 1.

In FIG. 8, a handle, illustrated as 77, is shown in the closed position. This handle pivots on a single pin 79 and is altered in detent position in accordance with a pin 81 in a detent slot 83 at the other end of handle 77. A dash line presentation is illustrated as 77' which shows the handle in a flexed or second detent condition. While this handle is shown without the step 51 normally associated with locking, such a feature can be added to handle 77 and as mentioned previously, the step 51 is only required if it is desirable to have the handle 24 flush with surfaces 16 and 18. If it can be contained within the card cage, such a step is not required in handle 77 of FIG. 8 and can be used in the form illustrated for both locking and non-locking functions.

In FIG. 9, a handle 90 is illustrated with slots 92 and 94 which receive pins 96 and 98. However, these pins 96 and 98 are not detented within slots 92 and 94. Rather, a third pin 100 is used which is detented within a deformable opening generally designated as 102 to place the handle 90 in a locked or non-flexed condition. Openings or cutout portions 104 and 106 are illustrated in the board as shown in one of the above referenced patents to provide a place to insert the fingers and to alter handle 90 from its locked position to a non-locked condition. The provision of holes 104 and 106 also reduce the amount of injury to the fingers which occurs when the electrical connector at the other end of the board is released from its counterpart on the rack. While there are instances that the handle of FIG. 9 may be desirable over that illustrated in the remaining figures, as I indicated previously the handle shown in the first few figures is the preferred embodiment to perform all the functions simultaneously of permanently locking, long wear and reduced injury to the fingers.

Although by no means limited thereto as the only material, one embodiment presently uses acetal copolymer plastic to form the handle including the deformable portion.

While I have attempted to illustrate several embodiments of my inventive concept to provide a handle which does not suffer the detrimental effects of continued use and additionally prevents injury to the person removing the module from a rack, I do not wish to be limited only to the embodiments shown as others will occur to those skilled in the art which still fall within the scope of my invention. Therefore, I wish to be limited only by the scope of the appended claims.

What is claimed is:

1. A flexible handle for use with track mounted apparatus containing a plurality of pulling pins wherein protection against accidental disengagement from the track mount is desirable comprising, in combination:
    an elongated central flexible handle member consisting of acetal copolymer plastic material;
    slot means at each extremity of said central member, said slot means comprising a deformable elongated restricted portion for restraining movement therethrough of the coacting pulling pins thereby creating a detect position, the handle member assuming a bowed condition when in a detented condition; and
    locking lip means on each extremity of said central member.

2. A handle as claimed in claim 1 comprising, in addition:
    a centrally located restraining type passageway for coaction with a further pin for aiding in keeping said handle member in an elongated position.

3. Flexible handle means consisting entirely of acetal copolymar plastic material comprising, in combination:
    elongated central portion means;
    a first end portion of said central means having an opening including first and second detent portions and a connecting elongated restricted passageway therebetween; and
    a second end portion of said central means having a second opening including first and second detect portions and a connecting restricted passageway therebetween.

* * * * *

UNITED STATES PATENT OFFICE
CERTIFICATE OF CORRECTION

PATENT NO. : 4,002,386
DATED : January 11, 1977
INVENTOR(S) : Robert W. McKenzie It is certified that error appears in the above-identified patent and that said Letters Patent are hereby corrected as shown below:

Column 1, line 12, delete "3,345,546" and substitute therefor --3,245,546; and

Column 1, line 25, delete "reference" and substitute therefor --referenced--.

Signed and Sealed this

Fifteenth Day of March 1977

[SEAL]

Attest:

RUTH C. MASON
Attesting Officer

C. MARSHALL DANN
Commissioner of Patents and Trademarks